(12) United States Patent
Nakamichi et al.

(10) Patent No.: US 11,815,749 B2
(45) Date of Patent: Nov. 14, 2023

(54) FUNCTIONAL ELEMENT HOUSING PACKAGE, AND SEMICONDUCTOR DEVICE AND LN MODULATOR

(71) Applicant: KYOCERA Corporation, Kyoto (JP)

(72) Inventors: Hiroyuki Nakamichi, Kirishima (JP); Takayuki Shirasaki, Omihachiman (JP)

(73) Assignee: Kyocera Corporation, Kyoto (JP)

( * ) Notice: Subject to any disclaimer, the term of this patent is extended or adjusted under 35 U.S.C. 154(b) by 1011 days.

(21) Appl. No.: 16/087,985

(22) PCT Filed: Mar. 27, 2017

(86) PCT No.: PCT/JP2017/012386
§ 371 (c)(1),
(2) Date: Aug. 7, 2020

(87) PCT Pub. No.: WO2017/164418
PCT Pub. Date: Sep. 28, 2017

(65) Prior Publication Data
US 2021/0208428 A1    Jul. 8, 2021

(30) Foreign Application Priority Data

Mar. 25, 2016 (JP) .................................. 2016-061104

(51) Int. Cl.
*G02F 1/03* (2006.01)
*H01L 23/055* (2006.01)
*H05K 1/18* (2006.01)
*G02F 1/055* (2006.01)

(52) U.S. Cl.
CPC .......... *G02F 1/0305* (2013.01); *H01L 23/055* (2013.01); *H05K 1/18* (2013.01); *H05K 1/189* (2013.01); *G02F 1/055* (2013.01); *H05K 2201/10121* (2013.01)

(58) Field of Classification Search
CPC ........... G02F 1/0305; G02F 1/055; G02F 1/03
See application file for complete search history.

(56) References Cited

U.S. PATENT DOCUMENTS

2016/0011486 A1*    1/2016    Sugiyama ............. G02F 1/2255
                                                                    385/2

FOREIGN PATENT DOCUMENTS

JP           2012-048121 A        3/2012

* cited by examiner

*Primary Examiner* — Joseph P Martinez
(74) *Attorney, Agent, or Firm* — Volpe Koenig

(57) ABSTRACT

A functional element housing package includes a pin terminal disposed in an outer region of a housing for housing a functional element. A wiring substrate is connected with the pin terminal. The wiring substrate includes a through hole for receiving the pin terminal, a first metallic layer disposed around an opening of the through hole on a side of the wiring substrate which side is located close to the housing, a second metallic layer disposed around an opening of the through hole on a side of the wiring substrate which is opposed to the side located close to the housing, the second metallic layer being greater in area than the first metallic layer, a connection wiring line connected to the first metallic layer or the second metallic layer, and a solder which connects the pin terminal to each of the first metallic layer and the second metallic layer.

7 Claims, 8 Drawing Sheets

FUNCTIONAL ELEMENT HOUSING PACKAGE, AND SEMICONDUCTOR DEVICE AND LN MODULATOR

TECHNICAL FIELD

The present invention relates to a functional element housing package including a wiring substrate at an input-output terminal of the package, and to a semiconductor device and an LN modulator each including the same.

BACKGROUND ART

There is a heretofore known functional element housing package (hereafter also referred to simply as "package") for housing an element which finds application in the fields of optical communications, etc., for example, an optical semiconductor element such as a semiconductor laser diode (LD) or a photodiode (PD), or an electro-optic crystal-utilizing LN optical device (refer to Patent Literature 1, for example). Such a package comprises a substrate including a mounting region for mounting a functional element, a housing composed of a frame body disposed so as to surround the mounting region, and a terminal which provides electrical conduction between an interior of the housing and an exterior thereof. A part of the terminal led out of the housing is connected with a wiring conductor. Moreover, the wiring conductor is electrically connected to an external circuit board.

Schemes have been put forth to achieve a downsizing of a wiring conductor connection system in a package for housing a high-frequency functional element.

In the construction disclosed in Patent Literature 1, a flexible circuit board is connected to a pin terminal passed through a housing. The flexible circuit board is provided with a high-frequency transmission line of a coplanar or microstrip configuration comprising a signal line and a grounding line. One end of the high-frequency transmission line is provided with a hole formed through the signal line and the grounding line. The pin terminal jutting out of the housing is inserted through this hole so as to be connected to the signal line or grounding line via solder.

CITATION LIST

Patent Literature

Patent Literature 1: Japanese Unexamined Patent Publication JP-A 2012-48121

SUMMARY OF INVENTION

A functional element housing package according to one embodiment of the invention comprises: a housing which houses a functional element; a pin terminal disposed in an outer region of the housing; and a wiring substrate connected with the pin terminal. The wiring substrate comprises: a through hole for receiving the pin terminal, a first metallic layer disposed around an opening of the through hole on a side of the wiring substrate which side is located close to the housing, a second metallic layer disposed around an opening of the through hole on a side of the wiring substrate which side is opposed to the side located close to the housing, the second metallic layer being greater in area than the first metallic layer, and a connection wiring line connected to the first metallic layer or the second metallic layer, and a solder which connects the pin terminal to each of the first metallic layer and the second metallic layer.

A semiconductor device according to one embodiment of the invention comprises: the functional element housing package mentioned above; and a semiconductor element housed inside the housing.

An LN modulator according to one embodiment of the invention comprises: the functional element housing package mentioned above; and an LN optical device housed inside the housing.

DESCRIPTION OF EMBODIMENTS

Figure 1:
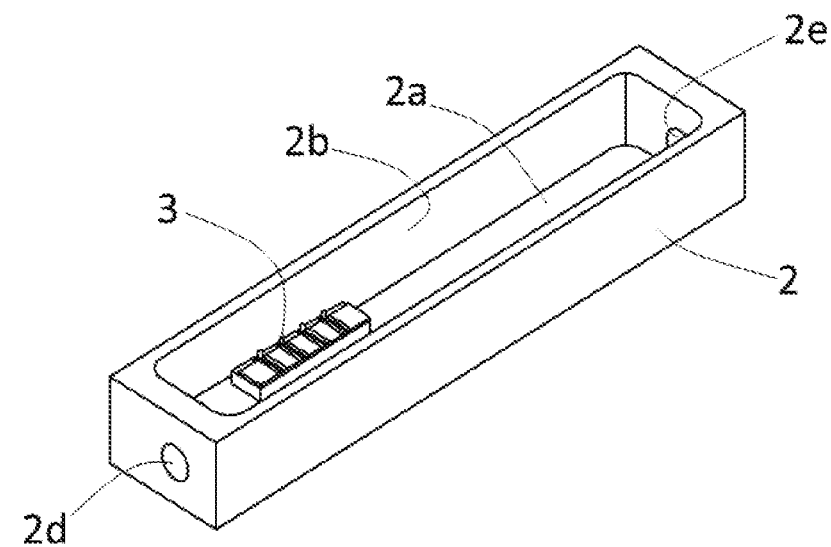
FIG. 1 is a perspective view showing a functional element housing package according to one embodiment of the invention.

Referring now to the drawings, an embodiment of the invention will be described below.

For convenience in illustrating the invention, of the constituent components of one embodiment of the invention, only the main components which are necessary for the understanding of the invention are shown in simplified form in each drawing to be hereafter referred to. Thus, on an as-needed basis, a functional element housing package, an LN modulator, or a semiconductor device according to the invention may be provided with additional members which are not shown in each drawing to be hereafter referred to. Moreover, in each drawing, the actual dimensions of each constituent member and dimensional ratio between the members are not represented precisely.

The following mainly describes an LN modulator mounting an LN optical device by way of example. Note that, with suitable changes in configuration design, for example, a semiconductor device mounting a light-emitting element such as LD or PD or a light-receiving element falls in the range of application of the invention.

Figure 2:
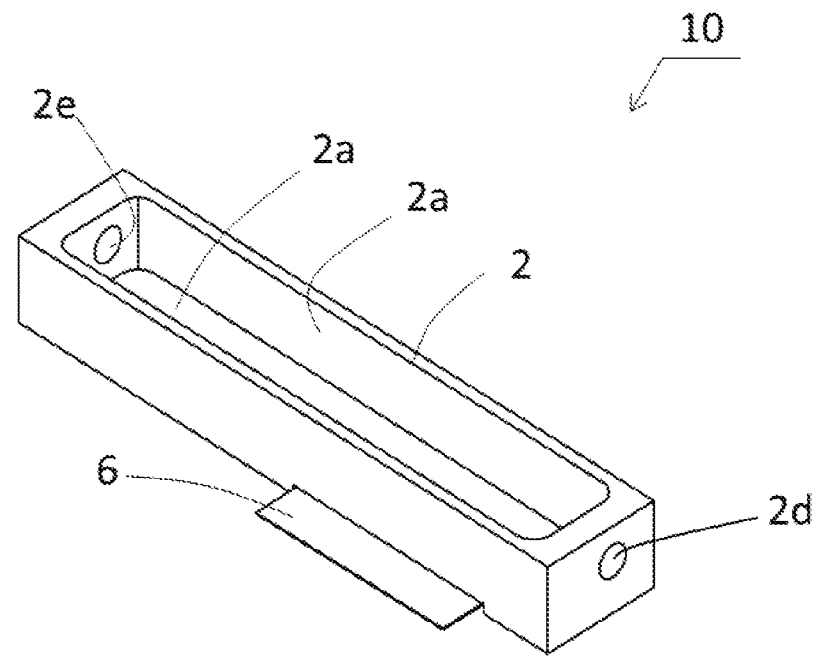
FIG. 2 is a perspective view showing an example of the package shown in FIG. 1 as viewed from above in a different direction.
Figure 3:
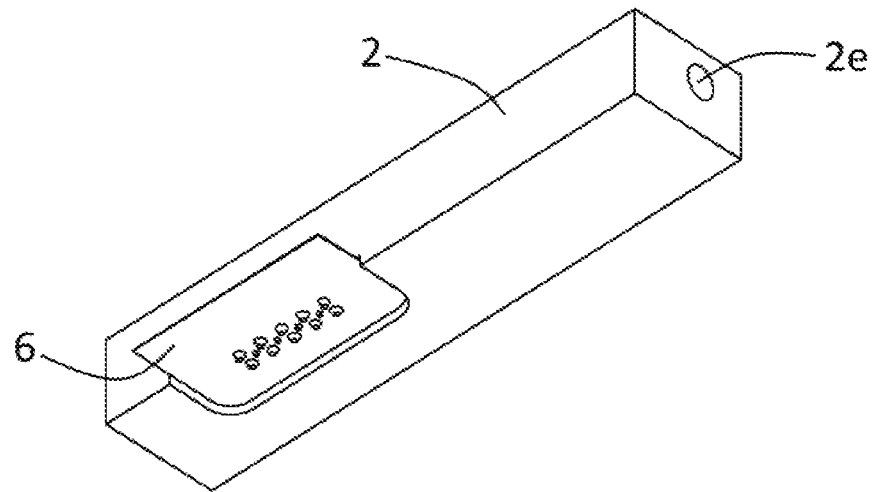
FIG. 3 is a perspective view of the package shown in FIG. 1, as viewed obliquely from below.
Figure 4:
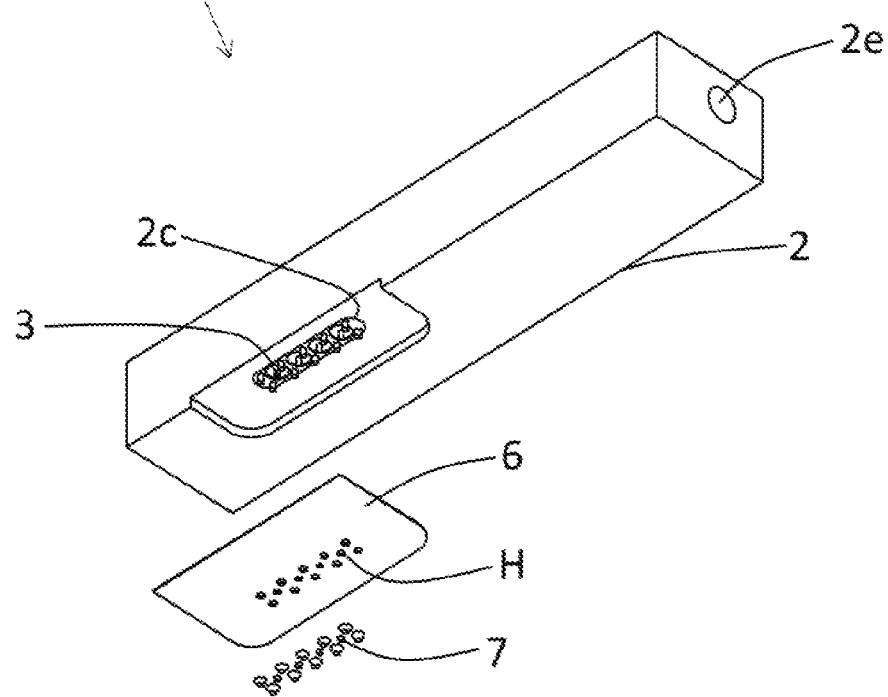
FIG. 4 is an exploded perspective view of the package shown in FIG. 3.
Figure 5A:
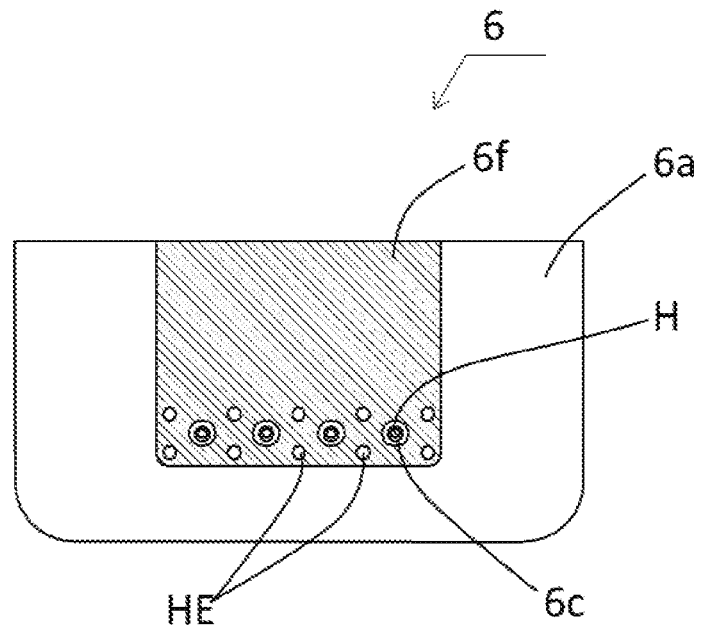
FIG. 5A is a plan view showing an example of one side a wiring substrate.
Figure 5B:
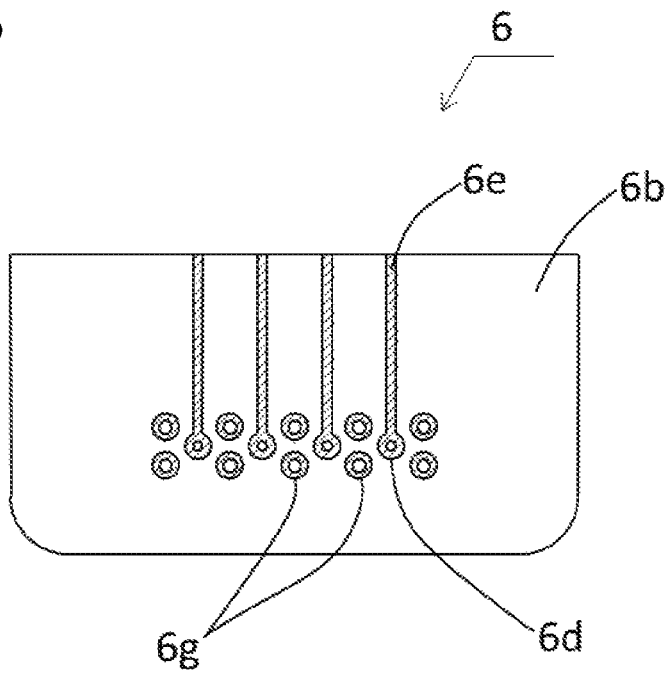
FIG. 5B is a plan view showing an example of the other side of the wiring substrate.
Figure 6:
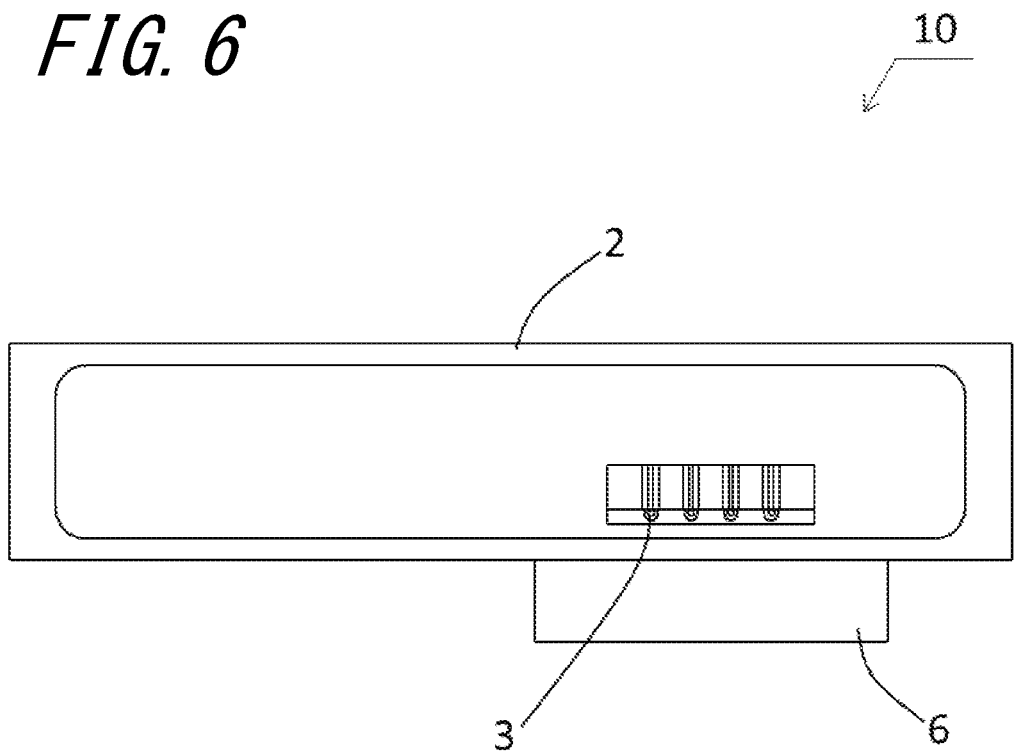
FIG. 6 is a plan view of the package shown in FIG. 1.
Figure 7:
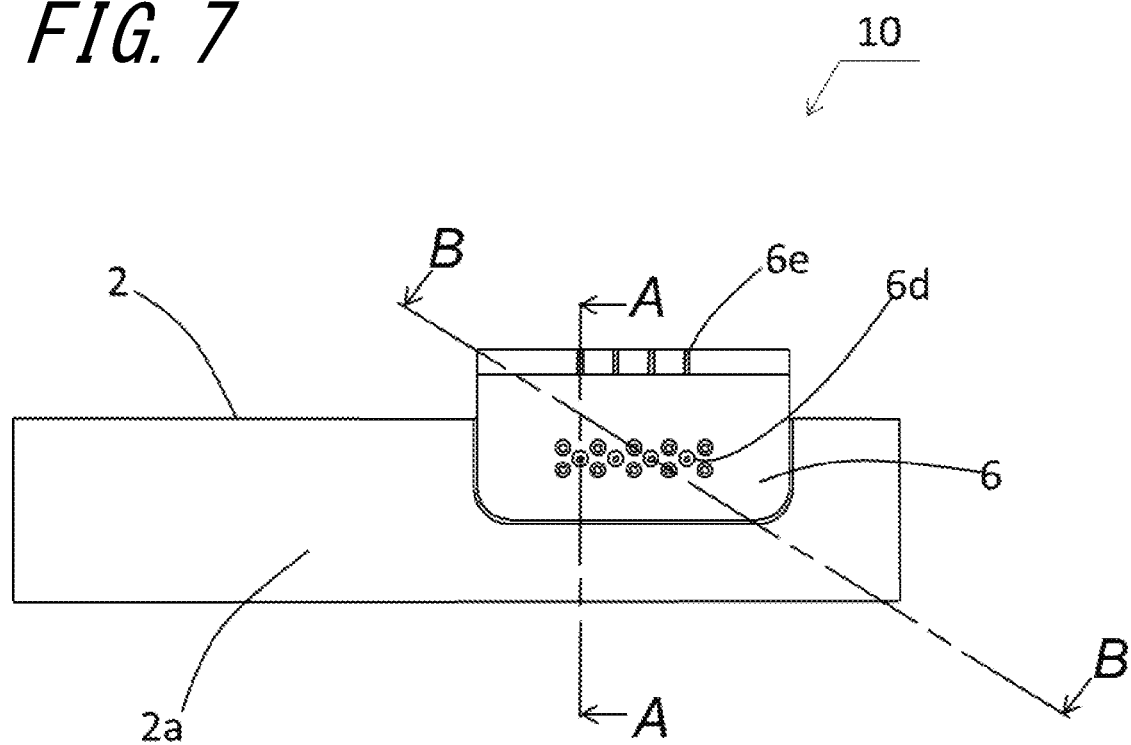
FIG. 7 is a bottom view of the package shown in FIG. 1.
Figure 8:
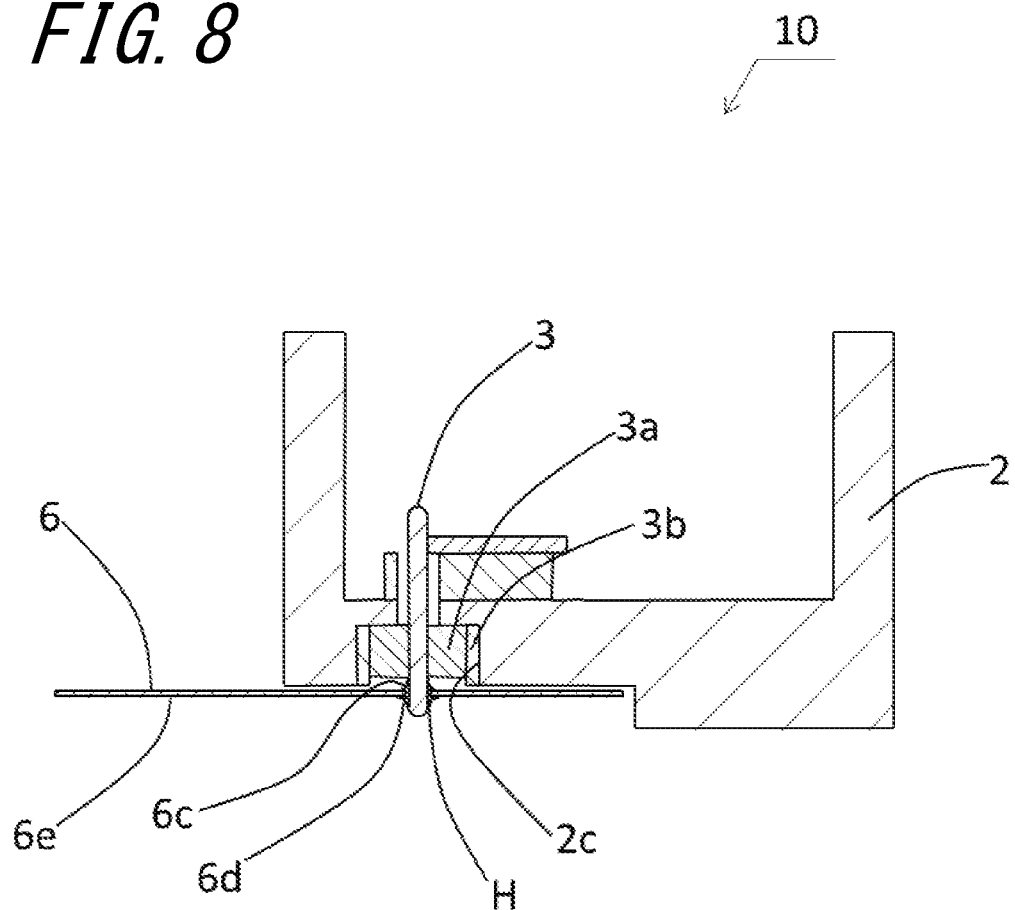
FIG. 8 is a sectional view of the package taken along the line A-A of FIG. 7.
Figure 9:
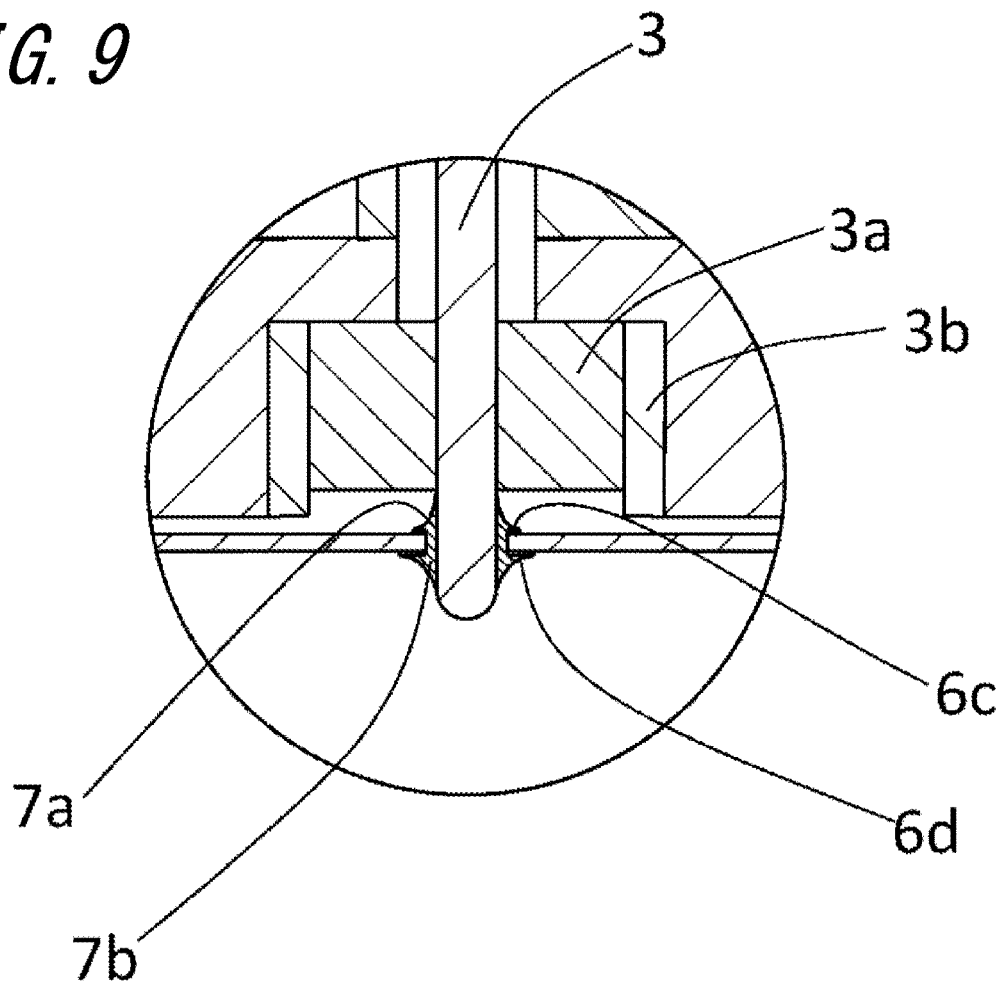
FIG. 9 is an enlarged sectional view of the main components of the package shown in FIG. 8.
Figure 10:
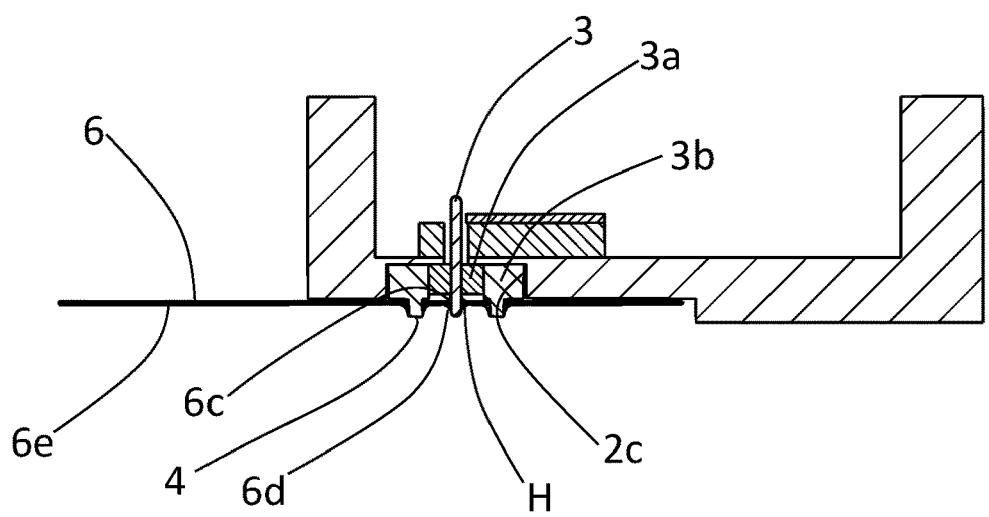
FIG. 10 is a sectional view of the package taken along the line B-B of FIG. 7.
Figure 11:
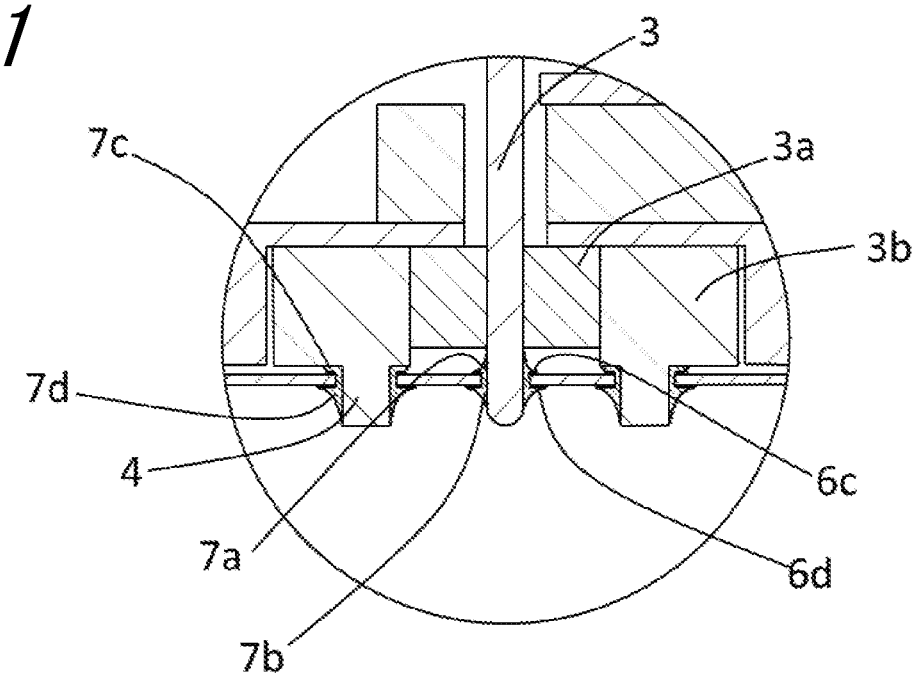
FIG. 11 is an enlarged sectional view of the main components of the package shown in FIG. 10.

FIG. 1 is a perspective view showing a functional element housing package 10 according to one embodiment of the invention. FIG. 2 is a perspective view of the package 10 shown in FIG. 1, as viewed from the left. FIG. 3 is a perspective view of the package 10 shown in FIG. 1, as viewed obliquely from below. FIG. 4 is an exploded perspective view of the package 10 shown in FIG. 3, with a wiring substrate 6 removed. FIG. 5A is a plan view of one surface 6a of the wiring substrate 6, and FIG. 5B is a plan view of the other surface 6b of the wiring substrate 6. Moreover, FIG. 6 is a plan view of the package 10, as viewed from the top, and FIG. 7 is a plan view of the package 10, as viewed from the bottom. FIG. 8 is a sectional view taken along the line A-A of FIG. 7, and, FIG. 10 is a sectional view taken along the line B-B of FIG. 7. FIG. 9 is an enlarged sectional view of the main components of the package shown in FIG. 8, and, FIG. 11 is an enlarged sectional view of the main components of the package shown in FIG. 10. For example, as shown in FIGS. 2 to 4, the functional element housing package 10 according to the present embodiment (hereafter also referred to simply as "package 10") is built as, although not designated by reference symbol in the drawings, a wiring substrate-equipped functional element housing package.

The package 10 includes a housing 2 for mounting a functional element 1. The functional element 1 is disposed on a bottom plate portion 2a of the housing 2. For example, the housing 2 is formed of a ceramic material, a metal material, a glass material, or a highly heat-resistant resin material. Examples of the ceramic material include an aluminum oxide ($Al_2O_3$) sintered body, a mullite ($3Al_2O_3 \cdot 2SiO_2$) sintered body, silicon carbide (SiC) sintered body, an aluminum nitride (AlN) sintered body, a silicon nitride ($Si_3N_4$), sintered body and glass ceramics. Examples of the metal material include a Fe-based alloy, oxygen-free copper, and SUS. Examples of the glass material include borosilicate glass and quartz glass. Examples of the highly heat-resistant resin material include polyimide.

For example, the housing 2 has the general form of a rectangular prism which is 30 mm to 100 mm in length, 5 mm to 20 mm in width, and 5 mm to 20 mm in height. The housing 2 of this embodiment is, as exemplified, 50 mm in length, 10 mm in width, and 6.5 mm in height.

The housing 2 is provided with a recessed portion which opens on an upper surface (to which is joined a lid body which will hereafter be described) thereof. That is, the housing 2 includes a frame portion 2b disposed along the periphery of the bottom plate portion 2a so as to surround the mounting region for the functional element 1. The housing 2 is composed of the bottom plate portion 2a and the frame portion 2b combined in one piece. The housing 2 is produced by joining the separately prepared bottom plate portion 2a and frame portion 2b together via a joining member such as a solder, a brazing material or an adhesive.

The housing 2 is provided with a hole 2c formed through its outer region. In the package according to this embodiment, the through hole 2c is provided in the bottom plate portion 2a of the housing 2. When the through hole 2c is provided in the bottom plate portion 2a of the housing 2, it is possible to reduce the area required to place the housing 2 on an external wiring board on which the housing 2 is mounted. Note that the through hole 2c may be provided in the frame portion 2b as needed.

A pin terminal 3 is located in the through hole 2c of the housing 2. The pin terminal 3 is passed through (inserted into) the through hole 2c in its lengthwise direction and fixed in place. The pin terminal 3 allows a high-frequency electric signal to be conducted between the interior of the housing 2 and the exterior thereof. The pin terminal 3 is disposed in the through hole 2c, with a dielectric 3a lying between the pin terminal 3 and the surface of the inner periphery of the through hole 2c. The pin terminal 3 and the through hole 2c define a coaxial line structure suited to conducting high-frequency electric signals.

The pin terminal 3 is formed of metal such as a Fe—Ni material or a Fe—Ni—Co material in linear form which is 0.2 mm to 1 mm in thickness and 2 mm to 5 mm in length. Moreover, the dielectric body 3a is formed of a dielectric material such as ceramics, glass, or resin. The dielectric body 3a provides a seal between the pin terminal 3 and the surface of the inner periphery of the through hole 2c. The dielectric 3a serves also as a bonding material for adhering the pin terminal 3 to the inner side of the through hole 2c. The pin terminal 3 is not limited in number to one. For example, in the package 10 according to this embodiment, a plurality of pin terminals 3 are aligned in parallel with the side wall of the frame portion 2b. Moreover, as practiced in this embodiment, the pin terminal 3 may be implemented by setting a plurality of pin terminals 3 and dielectric bodies 3a inside a tubular body 3b, and thereafter joining this tubular body 3b to the housing 2.

In this embodiment, by way of example, the pin terminal 3 is formed of metal which is 0.3 mm in thickness and 3.45 mm in length. As the dielectric body 3a, a low-melting-point glass material is placed so as to fill the gap between the pin terminal 3 and the inner wall surface of the through hole 2c which is 1.6 mm in inside diameter.

Moreover, for example, the outer region of the housing 2 is provided with, in addition to the pin terminal 3, an input-output terminal for providing electrical conduction between the interior of the housing 2 and the exterior thereof and inputting a direct current. For example, the input-output terminal is disposed in the frame portion 2b, and used for the conduction of low-frequency signals, for example, for the supply of bias potential. The input-output terminal comprises conductor wiring passed through the interior of an insulating material. In this construction, the conductor wiring located inside the frame portion 2b is electrically connected to an internally-provided electronic element, etc. via a wire (bonding wire), for example. The conductor wiring located outside of the frame portion 2b is connected with a lead terminal, etc.

Meanwhile, the wiring substrate 6 is connected exteriorly to the pin terminal 3. For example, the wiring substrate 6 is an FPC (Flexible Printed Circuit) substrate. The FPC substrate is a flexible substrate composed of a base film formed of a resin film such as a polyimide film, with connection wiring located thereon. That is, the FPC substrate is foldable and bendable. Note that the wiring substrate 6 is not limited to the FPC substrate, but may be a non-flexible substrate such as a glass-epoxy substrate, for example.

FIGS. 5A and 5B are plan views showing both sides of the wiring substrate 6 by way of example. FIG. 5A shows one surface 6a (front side) of the wiring substrate 6, and FIG. 5B shows the other surface 6b (back side) of the wiring substrate 6 opposed to the one surface 6a. Although four through holes H are depicted in FIGS. 5A and 5B, the invention is not limited to this. That is, the number of the through holes H and associated conductors is equal to the number of the pin terminals 3 and is arbitrary.

The one surface 6a of the wiring substrate 6 is provided with a first metallic layer 6c located around the opening of the through hole H so as to surround the opening the through hole H. Around the first metallic layer 6c, there is provided a grounding conductor layer 6f in spaced relation thereto. The grounding conductor layer 6f has the form of so-called solid metallic layer. Moreover, the other surface 6b of the wiring substrate 6 is provided with a second metallic layer 6d located around the opening of the through hole H so as to surround the opening of the through hole H. The second metallic layer 6d is connected with a connection wiring line 6e extending to an end of the wiring substrate 6 (extending outwardly of the housing 2).

Moreover, in this embodiment, by way of example, a grounding pad 6g for permitting connection with the grounding conductor layer is provided around the second metallic layer 6d. The grounding pad 6g is located around the opening of a through hole HE. On the back side of the grounding pad 6g (one surface 6a), the grounding conductor layer 6f is formed around the through hole HE.

Where the wiring substrate 6 is built as an FPC substrate, the other end of the FPC substrate (substrate 6's end) is connected to an external circuit board (not shown). On the external circuit board, there are provided an electrode pad which is capable of connecting the other end of the connection wiring line 6e to the wiring of the external wiring board, and a connector, etc., for example.

For example, an insulating layer is provided to cover the wiring substrate 6, except its conductor end portions for establishing electrical connection with the pin terminal 3, a grounding pin terminal 4, and the external wiring board, or equivalently, the first metallic layer 6c, the second metallic layer 6d, the connection wiring line 6e, and the electrically connectable distal end of the grounding conductor layer 6f. In FIGS. 5A and 5B, there are shown the individual internal conductors of the wiring substrate 6, with the insulating layer omitted.

The second metallic layer 6d is greater in area than the first metallic layer 6c. For example, the second metallic layer 6d in circular form is 0.6 mm in diameter, whereas the first metallic layer 6c in circular form is 0.5 mm in diameter. Moreover, the first metallic layer 6c and the second metallic layer 6d are of symmetrical configuration about the center axis of the through hole H.

Around the second metallic layer 6d and the connection wiring line 6e, for example, a grounding conductor layer is formed at a predetermined interval. With the formation of the grounding conductor layer, the connection wiring line 6e serves, in conjunction with the grounding conductor layer, as a coplanar waveguide. This allows the wiring substrate 6 to effect transmission of high-frequency electric signals. Moreover, when the grounding conductor layer 6f is formed on the one surface 6a, the wiring substrate can be caused to function as so-called grounded coplanar waveguide.

Moreover, for example, the wiring substrate 6 can be caused to function as a microstrip waveguide where the other surface 6b remains free of the grounding conductor layer. In the wiring substrate 6 of this embodiment, a case where a microstrip waveguide is formed is exemplified. That is, the grounding conductor layer 6f is formed on the back side (one surface 6a) of the connection wiring line 6e situated on the other surface 6b. The connection wiring line 6e and the grounding conductor layer 6f constitute the microstrip waveguide.

The connection wiring line 6e does not necessarily have to be located on the other surface 6b. For example, the connection wiring line 6e may be located on the one surface 6a so as to be connected to the first metallic layer 6c. In this case, in order to cause them to function as a microstrip waveguide, the grounding conductor layer 6f is disposed on the other surface 6b which is opposed to the connection wiring line 6e.

The wiring substrate 6 so constructed is placed outside of the housing 2, with the one surface 6a facing toward the housing 2, and with the front end of the pin terminal 3 received in the through hole H. Then, the pin terminal 3 is connected to the first metallic layer 6c and the second metallic layer 6d via a solder 7 (solder 7a and solder 7b), whereupon the wiring substrate 6 is secured to the housing 2. As the solder 7, heretofore known solder 7 such as Sn—Ag—Cu solder, Sn—Zn—Bi solder, or Sn—Cu solder, for example, is used. The solder 7b is applied as a continuous solder portion extending from the second metallic layer 6d, through the outer periphery of the pin terminal 3, to the front end of the pin terminal 3. This allows the wiring substrate 6 to be secured to the tubular body 3b firmly. When the grounding conductor layer 6f is present, the grounding conductor layer 6f and the housing 2 are concurrently connected to each other via solder 7c, as will hereafter be described in detail.

In this embodiment, the grounding pin terminal 4 is also concurrently connected to the grounding pad 6g and the grounding conductor layer 6f via another solder (solder 7c and solder 7d). For example, the grounding pin terminal 4 protruding from the metal-made tubular body 3b is inserted into the through hole HE, and fixedly joined to the grounding conductor layer 6f and the grounding pad 6g via the solder 7c and the solder 7d. Moreover, the solder 7c and the solder 7d are applied as a continuous solder portion extending from the surface of the tubular body 3b to the front end of the grounding pin terminal 4. This makes it possible to secure the wiring substrate 6 to the tubular body 3b firmly, as well as to minimize the likelihood that an excess of the solder 7c and the solder 7d will spread wettably through the tubular body 3b, causing application of superfluous solder 7c to the grounding pin terminal 4 located between the wiring substrate 6 and the tubular body 3b. Thus, the package 10 according to the embodiment of the invention is capable of minimizing the likelihood that the value of characteristic impedance will deviate from the desired value at the pin terminal 3 located between the tubular body 3b and the wiring substrate 6.

Moreover, in this construction, the pin terminal 3 is configured so that the length of a part thereof which protrudes through the other surface 6b of the wiring substrate 6 is shorter than the length of a part of the grounding pin terminal 4 which protrudes through the other surface 6b of the wiring substrate 6. This allows the package 10 according to the embodiment of the invention to minimize the likelihood that the pin terminal 3 will be brought into contact with human body or an external member in the course of manufacture of the package 10, the semiconductor device, and the LN modulator. Thus, a likelihood that the pin terminal 3 will undergo deformation or breaking can be reduced, and occurrence of product defects can be reduced.

Moreover, the wiring substrate 6 is fixedly joined to the tubular body 3b, with a gap left between the wiring substrate 6 and the upper surface of the tubular body 3b (where the grounding pin terminal 4 is disposed). Consequently, in the package 10 according to the embodiment of the invention, the wiring substrate 6 becomes deformed to the desired extent in the course of manufacture of the package 10, the semiconductor device, and the LN modulator. This makes it possible to achieve distribution of the stress exerted on the deformed connection portion of the wiring substrate 6 and the grounding pin terminal 4, and thereby minimize the likelihood of detachment of the wiring substrate 6 from the grounding pin terminal 4.

While the surface of the inner periphery of the through hole H is free of a metallic conductor, the molten solder 7 spreads freely for distribution through the first metallic layer 6c and the second metallic layer 6d via the pin terminal 3.

The distribution of the solder 7 between the first metallic layer 6c and the second metallic layer 6d depends on the area ratio between the layers. Consequently, the solder 7b connecting the pin terminal 3 to the second metallic layer 6d of wider area is greater in volume than the solder 7a connecting the pin terminal 3 to the first metallic layer 6c. The volume of the solder 7b connecting the pin terminal 3 to the second metallic layer 6d can be increased.

The pin terminal 3 and the through hole 2c (or the tubular body 3b) define a coaxial line structure. A high-frequency signal is transmitted from the connection wiring line 6e through the second metallic layer 6d to the pin terminal 3, and then propagates through the coaxial line defined by the pin terminal 3 and the through hole 2c (or the tubular body 3b). However, when the first metallic layer 6c and the solder 7a joining the first metallic layer 6c to the pin terminal 3 are present at some intermediate part of the coaxial line, uniformity in coaxial structure at this part is lost, and therefore the propagation of high-frequency signal may be disturbed and signal losses may occur. Meanwhile, the joining portion of the second metallic layer 6d and the pin terminal 3 is located outside of the coaxial line structure, and the influence on high-frequency signal losses is considered to be small.

Thus, the connection of the pin terminal 3 is made via the first metallic layer 6c and the second metallic layer 6d which is greater in area than the first metallic layer 6c, and also the solder 7b is greater in volume than the solder 7a connecting the pin terminal 3 to the first metallic layer 6c. This makes it possible to improve the electrical characteristics of the high-frequency signal line structure, as well as to enhance the strength of connection between the pin terminal 3 and the wiring substrate 6.

For example, a part lying between the wiring substrate 6 and the housing 2 of the pin terminal 3 is shorter than a part protruding through the other surface 6b of the wiring substrate 6 of the pin terminal 3. It is preferable that a part lying between the housing 2 and the wiring substrate 6 of the pin terminal 3 is smaller in surface area than a part protruding from the second metallic layer of the wiring substrate 6 of the pin terminal 3.

Where the part lying between the housing 2 and the wiring substrate 6 of the pin terminal 3 is smaller in surface area than the part protruding from the wiring substrate 6 of the pin terminal 3, the volume of the solder 7a provided within the described coaxial line structure can be reduced, whereas the volume of the solder 7b which is believed to have little influence on high-frequency characteristics can be increased. This makes it possible to maintain the electrical characteristics of the interior of the coaxial line structure satisfactorily, as well as to enhance the joining strength between the pin terminal 3 and the wiring substrate 6 at the front end of the pin terminal 3.

Further, the first metallic layer 6c and the second metallic layer 6d are of a symmetrical shape with respect to the pin terminal 3, for example, a circular shape. Thus, the solder 7a and the solder 7b joining the pin terminal 3 to the first and second metallic layers 6c and 6d are solidified in a symmetrical conical meniscus shape with respect to the pin terminal 3. This allows the coaxial line structure defined by the pin terminal 3 and the through hole 2c to be symmetrical about the center axis of the pin terminal 3, and thus to maintain the high-frequency electrical characteristics satisfactorily. Moreover, the thermal stress exerted on the connection portion of the pin terminal 3 and the wiring substrate 6 is developed symmetrically around the pin terminal 3. This helps reduce localized stress application to part of the solder 7a.

The solder 7b joining the pin terminal 3 to the second metallic layer 6d is wider in surface area than the solder 7a joining the pin terminal 3 to the first metallic layer 6c. This makes it possible to increase electrostatic capacitance among a part of the pin terminal 3 protruding out of the wiring substrate 6, the grounding pin terminal 4, and the grounding conductor layer 6f provided in the wiring substrate 6.

Figure 12:
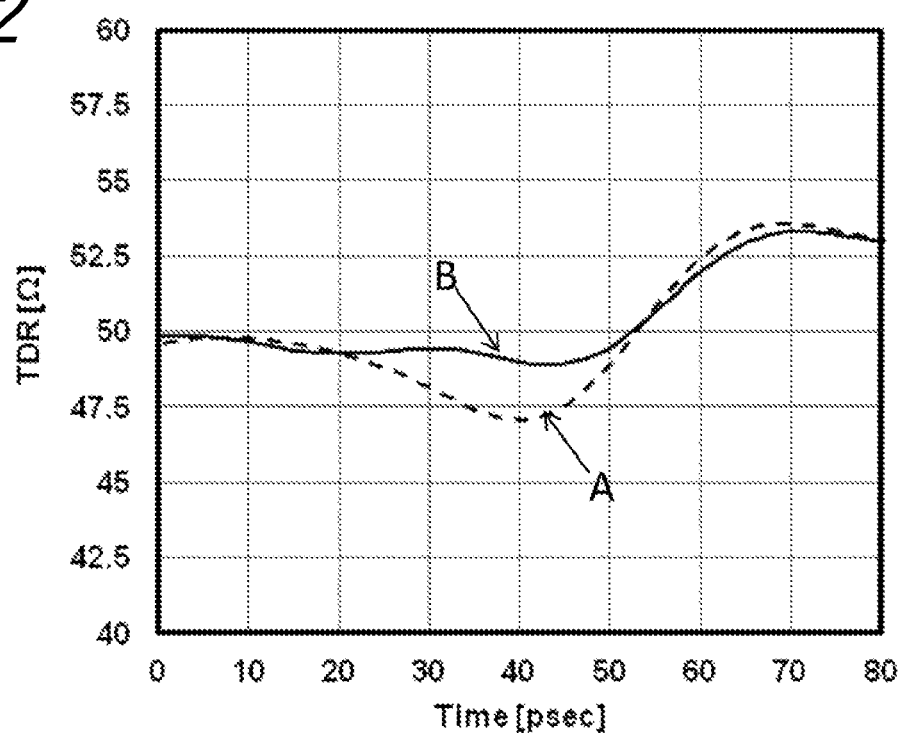
FIG. 12 is a chart for explaining high-frequency characteristics.

It has been found that an improvement in high-frequency characteristics can be achieved by so securing the wiring substrate 6 via the solder 7. FIG. 12 is a chart indicating a TDR (time domain reflectometry) measurement-based comparison of the high-frequency characteristics of the packages with respect to the dimensions of the first metallic layer 6c and the second metallic layer 6d. In FIG. 12, the broken line A represents the result of measurement as to a case where the first metallic layer 6c and the second metallic layer 6d have the same exterior size set at 0.6 mm. The solid line B represents the result of measurement as to a case where the first metallic layer 6c and the second metallic layer 6d are 0.5 mm and 0.6 mm, respectively, in exterior size, and the solder 7a is smaller in volume than the solder 7b.

It will be understood from FIG. 12 that, in the case where the first metallic layer 6c is smaller in area than the second metallic layer 6d or in the case where the solder 7a is smaller in volume than the solder 7b, the package 10 is advantageous in characteristic impedance matching. That is, in this case, it has been found that a deviation from the characteristic impedance of 50Ω has been improved from 47Ω to 49Ω at the position joined to the pin terminal 3, which shows 2-Ω improvement has been achieved.

Moreover, the solder 7b and the solder 7d are applied so that the spacing between them becomes wider gradually toward the front end of each of the pin terminal 3 and the grounding pin terminal 4. This allows the package 10 according to the embodiment of the invention to minimize the likelihood that characteristic impedance fluctuations will occur at the joining portion of the wiring substrate 6 and the pin terminal 3 as well as the grounding pin terminal 4.

Figure 13:
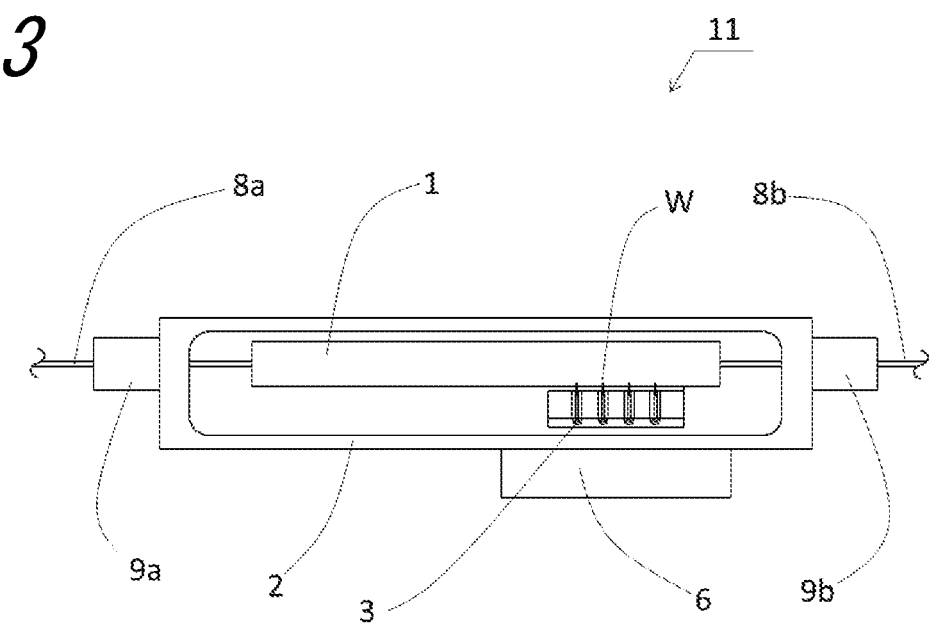
FIG. 13 is a plan view showing an LN modulator according to one embodiment of the invention.

The functional element housing package (package) 10 according to the present embodiment receives the functional element 1 inside the housing 2. Examples of the functional element 1 include LN optical devices utilizing an electro-optic crystal such as a lithium niobate substrate, and semiconductor elements such as LD and PD. Each such a semiconductor element is a high-frequency semiconductor element which operates with high-frequency electric signals. In addition, examples of functional elements which operate with high-frequency electric signals include a resistor, a piezoelectric element, a quartz oscillator, and a ceramic oscillator. Note that the high-frequency range assumed for this construction corresponds roughly to the range of 1 GHz to 100 GHz. Referring now to FIG. 13, an LN modulator 11 using an LN optical device which serves as the functional element 1 will be described by way of example.

The functional element 1 such as an LN optical device is placed on the bottom plate portion 2a of the housing 2, with an electrode thereof connected to the pin terminal 3. Moreover, the housing 2 is provided with securing members 9a and 9b, each disposed in corresponding one of optical fiber-mounting holes 2d and 2e, for connecting optical fibers. Optical fibers 8a and 8b are each inserted through the optical fiber-mounting hole 2d, 2e and the securing member 9a, 9b so as to be optically connected to a waveguide mounted on the LN optical device. Via the securing member 9a, 9b, the optical fiber 8a, 8b is fixedly attached to the housing 2.

A waveguide is formed on the LN optical device. An optical signal inputted through one optical fiber 8a attached to the securing member 9a is optically coupled to one end of the waveguide, and propagates over the waveguide. After undergoing modulation on the LN optical device under the action of a high-frequency electric signal fed from the pin terminal 3 through a bonding wire W, the optical signal is outputted from the other end of the waveguide toward the other optical fiber 8b attached to the securing member 9b.

Lastly, a lid body (not shown) is joined to the upper surface of the frame portion 2b. That is, the lid body is bonded to the upper surface of the frame portion 2b via a connecting member such as a solder or a brazing material so as to define, for example, a sealed hollow structure by closing the functional element 1—housing space formed by the housing 2 for hermetic sealing.

As described above, according to the invention, the second metallic layer 6d which is greater in area than the first metallic layer 6c and the pin terminal 3 are connected to each other via the solder 7. Thus, it is possible to provide the functional element housing package 10, as well as the semiconductor device 11 and the LN modulator 11 which have excellent high-frequency characteristics.

It should be understood that the application of the invention is not limited to the described embodiments and examples, and that various changes and modifications are possible without departing from the scope of the invention. For example, although the area per se of the first metallic layer 6c is adjusted to be smaller than the area of the second metallic layer 6d in the described embodiment, the invention is not limited to this. For example, the first metallic layer 6c may be made equal to or greater than the second metallic layer 6d in area. In this case, the outer periphery of the first metallic layer 6c is covered with the insulating layer covering the one surface 6a of the wiring substrate 6. Consequently, the area of the exposed inner periphery of the first metallic layer 6c subjected to application of the solder 7a is smaller than the area of the exposed second metallic layer 6d. This makes it possible to substantially reduce the area of the first metallic layer 6c subjected to application of the solder 7a, and thereby adjust the volume of the solder 7a connecting the pin terminal 3 to the first metallic layer 6c to be smaller than the volume of the solder 7b connecting the pin terminal 3 to the second metallic layer 6d.

Moreover, as employed in the description of the embodiment, the terms "top", "upper", "bottom", "left", right", etc. are used merely for the purpose of explaining the relation between the positions of constituent components as viewed in each drawing, and thus these terms do not represent positional relationship in the construction in actual use.

REFERENCE SIGNS LIST

1: Functional element
2: Housing
2a: Bottom plate portion
2b: Frame portion
2c: Through hole
2d, 2e: Optical fiber-mounting hole
3: Pin terminal
3a: Dielectric body
4: Grounding pin terminal
6: Wiring substrate
6a: One surface
6b: Other surface
6c: First metallic layer
6d: Second metallic layer
6e: Connection wiring line
6f: Grounding conductor layer
6g: Grounding pad
7: Solder
8a, 8b: Optical fiber
9a, 9b: Securing member
W: Bonding wire
H: Through hole

The invention claimed is:

1. A functional element housing package, comprising:
a housing which houses a functional element;
a pin terminal disposed in an outer region of the housing; and
a wiring substrate comprising
a through hole for receiving the pin terminal,
a first metallic layer disposed around an opening of the through hole on a side of the wiring substrate which side is located close to the housing,
a second metallic layer disposed around an opening of the through hole on a side of the wiring substrate which side is opposed to the side located close to the housing, the second metallic layer being greater in area than the first metallic layer,
a connection wiring line connected to the first metallic layer or the second metallic layer, and
a solder which connects the pin terminal to each of the first metallic layer and the second metallic layer.

2. The functional element housing package according to claim 1,
wherein a part of the solder connecting the pin terminal to the first metallic layer is smaller in volume than a part of the solder connecting the pin terminal to the second metallic layer.

3. The functional element housing package according to claim 1,
wherein a part lying between the housing and the wiring substrate of the pin terminal is smaller in surface area than a part protruding through the second metallic layer of the pin terminal.

4. The functional element housing package according to claim 1,
wherein the first metallic layer and the second metallic layer are of symmetrical configuration about a center axis, and
the pin terminal is positioned in the center axis.

5. The functional element housing package according to claim 1,
wherein the pin terminal is disposed on a bottom surface of the housing.

6. A semiconductor device, comprising:
the functional element housing package according to claim 1; and
a semiconductor element housed inside the housing.

7. An LN modulator, comprising:
the functional element housing package according to claim 1; and
an LN optical device housed inside the housing.

* * * * *